United States Patent
Vilhonen et al.

(10) Patent No.: US 6,972,633 B2
(45) Date of Patent: Dec. 6, 2005

(54) CALIBRATING A LOOP-FILTER OF A PHASE LOCKED LOOP

(75) Inventors: Sami Vilhonen, Littoinen (FI); Jari Melava, Salo (FI)

(73) Assignee: Nokia Corporation, Espoo (FI)

( * ) Notice: Subject to any disclaimer, the term of this patent is extended or adjusted under 35 U.S.C. 154(b) by 85 days.

(21) Appl. No.: 10/650,367

(22) Filed: Aug. 27, 2003

(65) Prior Publication Data

US 2005/0046487 A1 Mar. 3, 2005

(51) Int. Cl.[7] .............................................. H03L 7/107
(52) U.S. Cl. ........................ 331/17; 331/44; 327/156
(58) Field of Search .............................. 331/17, 16, 34, 331/44; 327/553, 554, 557, 156

(56) References Cited

U.S. PATENT DOCUMENTS

| | | | |
|---|---|---|---|
| 5,245,646 A | | 9/1993 | Jackson et al. ................. 377/2 |
| 6,281,829 B1 | * | 8/2001 | Amrany et al. ............. 341/155 |
| 6,583,662 B1 | * | 6/2003 | Lim ............................ 327/553 |
| 6,731,145 B1 | * | 5/2004 | Humphreys et al. ........ 327/156 |
| 2002/0190810 A1 | * | 12/2002 | Nystrom et al. ........... 333/17.1 |

FOREIGN PATENT DOCUMENTS

| EP | 0910165 | 4/1999 |
|---|---|---|
| WO | WO 02/073801 | 9/2002 |

OTHER PUBLICATIONS

W. Thommann et al., "*Fully Integrated W-CDMA If Receiver and If Transmitter Including If Synthesizer and On-Chip VCO for UMTS Mobiles*", IEEE Journal of Solid-State Circuits, IEEE Inc., New York, US, Sep. 2001, pp. 1407-1419.

A.M. Durham et al., "*Circuit Architectures for High Linearity Monolithic Continuous-Time Filtering*", IEEE Transactions on Circuits and Systems II: Analog and Digital Signal Processing, IEEE Inc., New York, US, Sep. 1, 1991; pp. 651-657.

* cited by examiner

*Primary Examiner*—Joseph Chang
(74) *Attorney, Agent, or Firm*—Alfred A. Fressola; Ware, Fressola, Van Der Sluys & Adolphson LLP

(57) ABSTRACT

The invention relates to a method of automatically calibrating a loop-filter of a phase locked loop, which loop-filter comprises at least one RC-filter component and is integrated on a single chip together with at least one RC-filter component of another entity than the phase locked loop. In order to simplify a calibration of the loop-filter, the method comprises tuning the at least one RC-filter component of the loop-filter based on measurements performed on the at least one RC-filter component of the other entity. The invention relates equally to an integrated circuit chip comprising means for realizing this method and to a unit including such a chip.

12 Claims, 2 Drawing Sheets

CALIBRATING A LOOP-FILTER OF A PHASE LOCKED LOOP

FIELD OF THE INVENTION

The invention relates to a method of automatically calibrating a loop-filter in a phase locked loop. The invention relates equally to an integrated circuit chip comprising a loop-filter for a phase locked loop and to a unit comprising such an integrated circuit chip.

BACKGROUND OF THE INVENTION

Phase locked loops (PLL) are negative feedback loops which are well known from the state of the art.

A PLL comprises a voltage controlled oscillator (VCO), which generates the output signal of the PLL. This output signal can be used for example as local oscillator signal for a receiver mixer of a receiver chain or a transmitter mixer of a transmitter chain in a mobile terminal. The VCO is driven by a loop-filter, which determines the loop characteristics of the PLL, e.g. the settling time and the loop stability. The response of the loop-filter has therefore to be very accurate. An accurate response is given, if the RC (resistor-capacitor) product of RC-filter components of the loop-filter corresponds exactly to a predetermined RC-product so that a desired filter frequency is achieved at each RC-filter component.

In order to reduce the number of external components, it is further desirable to use an integrated loop-filter in a PLL. With an integrated loop-filter, also the probability of a disruptive coupling is reduced. The values of integrated components, however, vary much more than the values of external accurate components due to process variations or environmental influences. External Negative Positive Zero (NPO) capacitors, for example, have a very stable value over a wide temperature range, usually between −25° C. and +85° C.

Therefore, conventional PLLs generally comprise accurate external components for the loop-filter. When an integrated loop-filter is used nevertheless, a complicated calibration procedure is employed.

SUMMARY OF THE INVENTION

It is an object of the invention to enable a simple calibration of an integrated loop-filter of a PLL.

A method of automatically calibrating a loop-filter of a phase locked loop is proposed, which loop-filter comprises at least one RC-filter component and is integrated on a single chip together with at least one RC-filter component of another entity than the phase locked loop. The proposed method comprises tuning the at least one RC-filter component of the loop-filter based on measurements performed on the at least one RC-filter component of this other entity.

Moreover, an integrated circuit (IC) chip is proposed, which comprises a loop-filter for a phase locked loop, which loop-filter includes at least one RC-filter component. The proposed chip comprises in addition at least one RC-filter component for another entity than the phase locked loop. Furthermore, the proposed chip comprises a calibrating component for performing measurements on the at least one RC-filter component of the other entity and for tuning the at least one RC-filter component of the loop-filter based on such measurements.

Finally, a unit is proposed which comprises the proposed IC chip.

The invention proceeds from the consideration that a loop-filter can be calibrated by tuning at least one RC-filter component of the loop-filter. The invention proceeds further from the consideration that most chips on which a loop-filter would be integrated comprise at least one tunable RC-filter component belonging to some other entity. The invention proceeds further from the consideration that process variations and environmental influences like temperature can be expected to be very similar for all RC-filters on a single chip. It is therefore proposed that measurements performed for tuning an RC-filter of another entity on the same IC chip are used as well for tuning the RC-filters of the loop-filter.

It is an advantage of the invention that the integrated loop-filter is calibrated automatically without a dedicated complicated calibration circuit. Measurements for RC-filter components of other entities integrated on the same chip are usually carried out anyway, and according to the invention, such measurement results are simply used as well for calibrating the loop-filter.

The RC-filter component of the other entity can be for instance the RC-filter component of a base-band filter of a transmitter chain or the RC-filter component of a channel-select filter of a receiver chain, but equally any other tunable RC-filter component, as long as it is integrated on the same chip as the loop-filter.

The tuning of an RC-filter of the loop-filter can be performed by changing the value of a resistor of the RC-filter component, the value of a capacitor of the RC-filter component, or both. For calibrating the loop-filter, the tuning according to the invention is preferably performed for all RC-filter components of the loop-filter.

The proposed unit can be any unit which requires on the one hand a PLL and on the other hand some entity with a tunable RC-filter component. Such a unit can be for example a communication unit, like a mobile terminal, comprising a transmitter chain and a receiver chain.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not drawn to scale and that they are merely intended to conceptually illustrate the structures and procedures described herein.

DETAILED DESCRIPTION OF THE INVENTION

Figure 1:
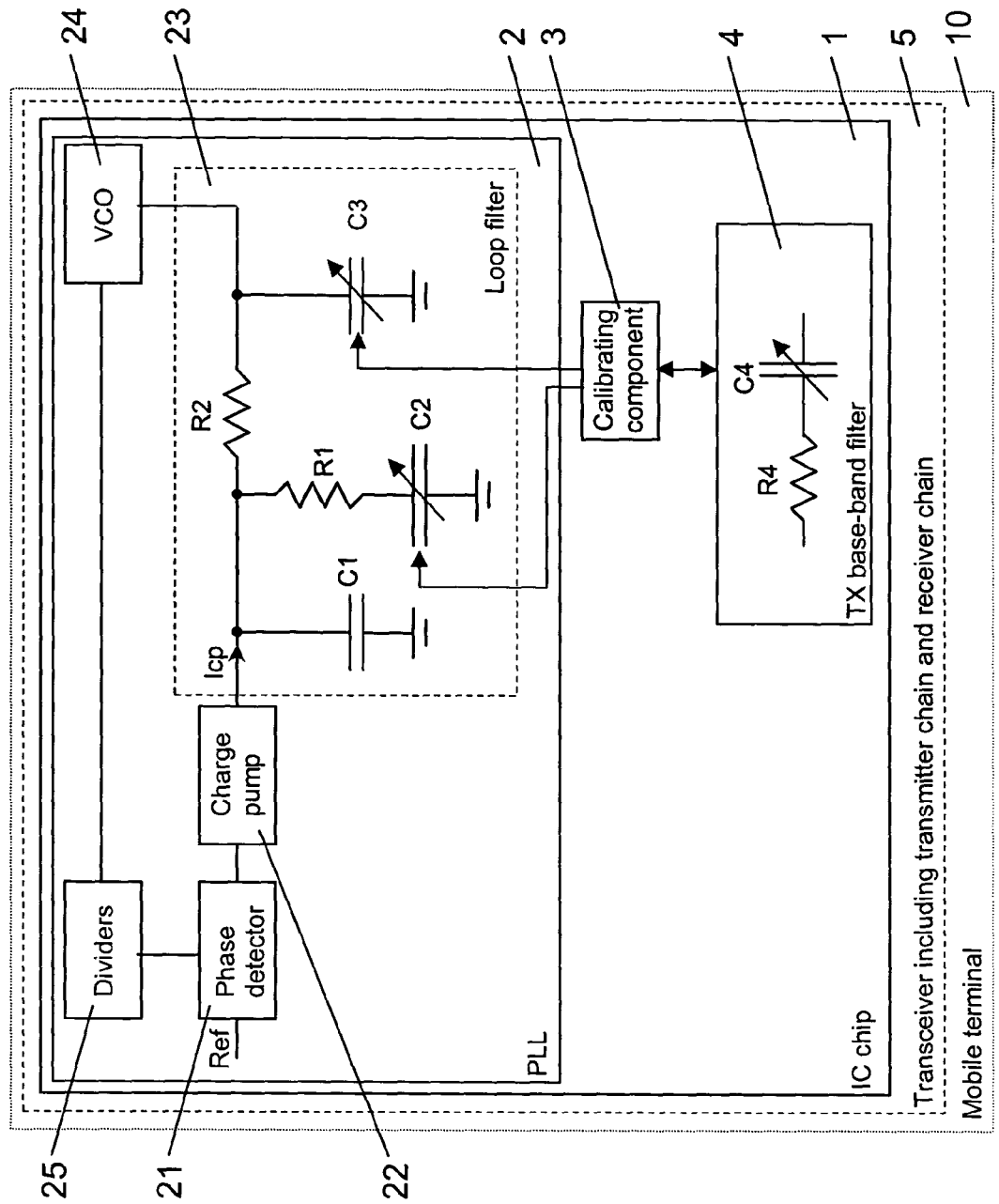
FIG. 1 schematically presents a block diagram of an embodiment of an IC chip according to the invention.

FIG. 1 schematically presents a preferred embodiment of an IC chip 1 according to the invention. The IC chip 1 is for use in a transceiver 5 of a mobile terminal 10, e.g. a cellular phone, which is indicated in FIG. 1 with dotted lines. The transceiver 5, which is indicated in FIG. 1 with dashed lines, includes a transmitter chain and a receiver chain.

The IC chip 1 comprises a PLL 2, a calibrating component 3 and at least a base-band filter 4 of the transmitter chain of the transceiver 5.

The PLL 2 includes, connected to each other in a loop in this order, a phase detector 21, a charge pump 22, a loop-filter 23, a VCO 24 and programmable frequency dividers 25.

The output of the charge pump 22 is thus connected to the input of the loop-filter 23. The input of the loop-filter 23 is connected within the loop-filter 23 via a first capacitor C1 to ground and in parallel via a series connection of a first resistor R1 and a second capacitor C2 to ground. The input of the loop-filter 23 is moreover connected within the loop-filter 23 via a second resistor R2 and a third capacitor C3 to ground. The connection between resistor R2 and capacitor C3 forms the output of the loop-filter 23, which is connected to the input of the VCO 24. Capacitor C2 and capacitor C3 are tunable capacitors.

The base-band filter 4 of the transmitter chain comprises at least a series connection of a resistor R4 and a tunable capacitor C4.

The calibrating component 3 has a controlling access to the base-band filter 4. In addition, the calibrating component 3 has a controlling access to capacitors C2 and C3 of the loop-filter 23.

The PLL 2 on the IC chip 1 operates in a well known manner. The VCO 24 generates a signal having a phase which is determined by an applied voltage. The frequency of the output VCO signal is divided by the frequency dividers 25 and the resulting signal is forwarded to the phase detector 21. In addition, a reference signal Ref having a known frequency is applied to a reference input of the phase detector 21. The phase detector 21 compares the phase of the frequency divided VCO signal with the phase of the reference signal Ref and outputs an error signal. The PLL 2 is locked when the two phases are equal, which implies that also the frequencies of the compared signals are equal.

For achieving or maintaining a locked state, the charge pump 22 generates current impulses Icp, the lengths of which are controlled by the output signal of the phase detector 21. As indicated by its name, the charge pump 22 thus pumps charges, i.e. a supplied current. The generated current pulses are filtered by the loop-filter 23, which provides a corresponding control voltage to the VCO 24 and thus takes care that the VCO 24 generates a signal having a desired frequency. The frequency of the signal output by the VCO 24 can be changed by changing the factor in the programmable frequency dividers 25. The phase locked VCO signal can be provided for example as a local oscillator signal to a mixer of the transmitter chain (not shown).

The base-band filter 4 of the transmitter chain performs a filtering of signals which are to be transmitted by the mobile terminal 10 in a well known manner.

Figure 2:
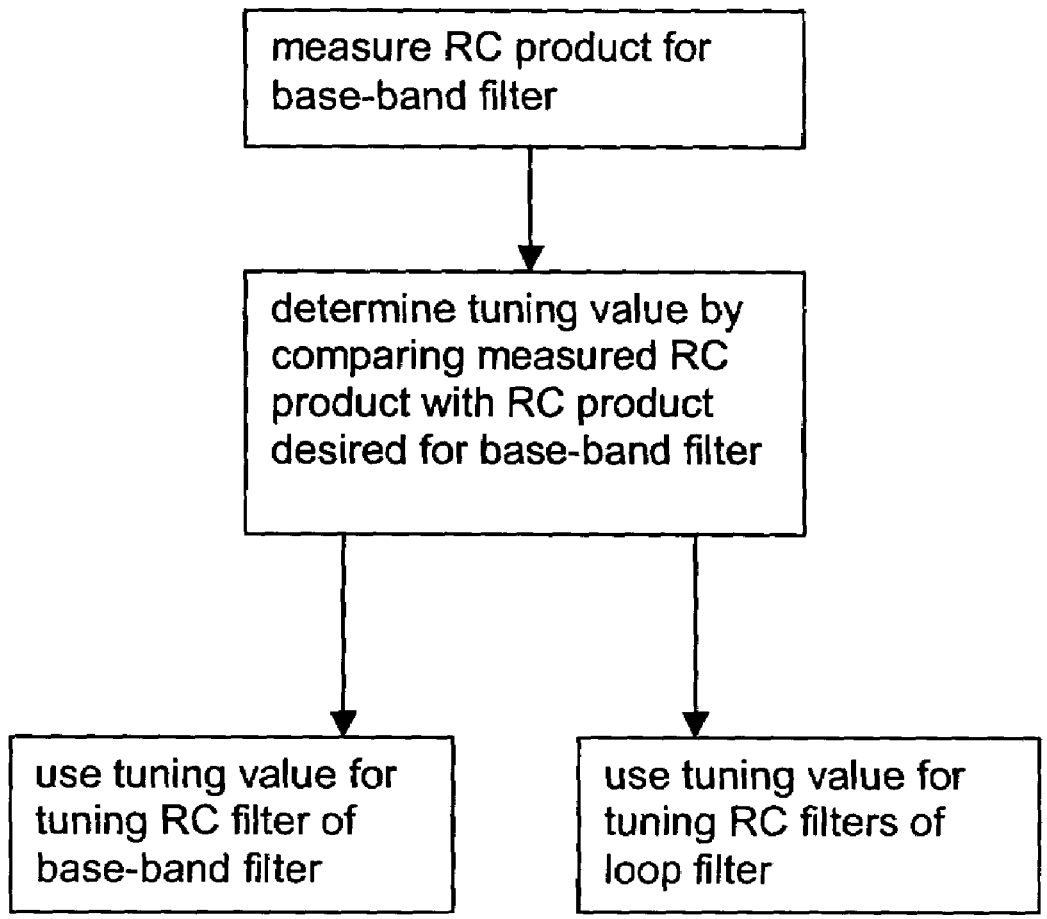
FIG. 2 is a flow chart illustrating an embodiment of the method according to the invention.

The calibrating component 3 is used for calibrating the base-band filter 4 and the loop-filter 23. The operation of the calibrating component 3 is illustrated in the flow chart of FIG. 2.

The calibrating component 3 calibrates the base-band filter 4 of the transmitter chain in a well known manner. The calibrating component 3 first measures the product of the resistance of resistor R4 and the capacitance of capacitor C4. The measured RC-product is compared to the RC-product which is required for the desired filter frequency. Based on the comparison, a tuning value is determined which is used for tuning the RC-product of the base-band filter 4 to the required RC-product. The tuning value can be for example a control word which represents a factor by which the capacitance of capacitor C4 has to be increased or reduced in order to achieve the required RC-product. The tuning can then be carried out by applying the control word to a control input of capacitor C4 for changing the capacitance of capacitor C4 accordingly.

According to the invention, the calibrating component 3 calibrates in addition the loop-filter 23. Since the RC-filter comprising resistor R4 and capacitor C4 is integrated on the same IC chip as the RC-filter comprising resistor R1 and capacitor C2 and as the RC-filter comprising resistor R2 and capacitor C3, the deviation of the real RC-product from a required RC-product will be basically the same in all three RC-filters. Therefore, the calibrating component 3 simply applies the control word determined for tuning capacitor C4 as well to the control input of capacitor C2 and to the control input of capacitor C3. As a result, also the RC-filter comprising resistor R1 and capacitor C2 and the RC-filter comprising resistor R2 and capacitor C3 are tuned to a desired frequency. The loop-filter 23 is thus calibrated in a simple way without a dedicated, complicated calibration circuit. In particular, no extra measurements have to be carried out for the loop-filter 23.

While there have been shown and described and pointed out fundamental novel features of the invention as applied to a preferred embodiment thereof, it will be understood that various omissions and substitutions and changes in the form and details of the devices and methods described may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A method of automatically calibrating a loop-filter of a phase locked loop, which loop-filter comprises at least one RC-filter component and is integrated on a single chip together with a calibrating component and with at least one RC-filter component of an entity other than said phase locked loop and other than said calibrating component, said method comprising tuning said at least one RC-filter component of said loop-filter by means of said calibrating component based on measurements performed on said at least one RC-filter component of said other entity.

2. A method according to claim 1, wherein tuning said at least one RC-filter component of said loop-filter is preceded by measuring an RC-product of said at least one RC-filter component of said other entity and by determining a tuning value for tuning said at least one RC-filter component of said other entity by comparing said measured RC-product with an RC-product known to be required for said at least one RC-filter component of said other entity, and wherein said tuning of said at least one RC-filter component of said loop-filter is based on said determined tuning value.

3. A method according to claim 2, wherein said tuning value is a control word which is applied to said at least one RC-filter component of said loop-filter for tuning said at least one RC-filter component of said loop-filter.

4. A method according to claim 1, wherein tuning said at least one RC-filter component of said loop-filter comprises changing at least the value of a resistor and/or the value of a capacitor of said at least one RC-filter component of said loop-filter.

5. An integrated circuit chip comprising:
   a loop-filter for a phase locked loop, which loop-filter includes at least one RC-filter component;
   a calibrating component; and
   at least one RC-filter component of an entity other than said phase locked loop and other than said calibrating component; and
   wherein said calibrating component is adapted to tune said at least one RC-filter component of said loop-filter based on measurements performed on said at least one RC-filter component for said other entity.

6. An integrated circuit chip according to claim 5, wherein said calibrating component performs said measurements by measuring an RC-product of said at least one RC-filter component for said other entity, wherein said calibrating component is further designed for determining a tuning value for tuning said at least one RC-filter component for said other entity by comparing a measured RC-product with a RC-product known to be required for said at least one RC-filter component for said other entity, and wherein said calibrating component tunes said at least one RC-filter component of said loop-filter based on said determined tuning value.

7. An integrated circuit chip according to claim 6, wherein said calibrating component determines a control word as said tuning value, and wherein said calibrating component applies a determined control word to said at least one RC-filter component of said loop-filter for tuning said at least one RC-filter component of said loop-filter.

8. An integrated circuit chip according to claim 5, wherein said at least one RC-filter component includes at least one of a tunable resistor and a tunable capacitor, and wherein said calibrating component tunes said at least one RC-filter component of said loop-filter by changing at least the value of said tunable resistor and/or the value of said tunable capacitor of said at least one RC-filter component of said loop-filter.

9. An integrated circuit chip according to claim 5, wherein said other entity is a base-band filter for a transmitter chain of a communication unit.

10. An integrated circuit chip according to claim 5, wherein said other entity is a channel-select filter for a receiver chain of a communication unit.

11. A unit comprising an integrated circuit chip with:
    a loop-filter for a phase locked loop, which loop-filter includes at least one RC-filter component;
    a calibrating component; and
    at least one RC-filter component of an entity other than said phase locked loop and other than said calibrating component; and
    wherein said calibrating component is adapted to tune said at least one RC-filter component of said loop-filter based on measurements performed on said at least one RC-filter component for said other entity.

12. A unit according to claim 11, wherein said unit is a communication unit comprising a transmitter chain and a receiver chain, and wherein said other entity is one of a base-band filter for said transmitter chain and a channel-select filter for said receiver chain.

* * * * *